(12) United States Patent
Mentzer

(10) Patent No.: US 8,525,284 B2
(45) Date of Patent: Sep. 3, 2013

(54) SYSTEM FOR REDUCING SENSOR AREA IN A BACK SIDE ILLUMINATED CMOS ACTIVE PIXEL SENSOR

(75) Inventor: Ray Alan Mentzer, Corvallis, OR (US)

(73) Assignee: Aptina Imaging Corporation, George Town (KY)

( * ) Notice: Subject to any disclaimer, the term of this patent is extended or adjusted under 35 U.S.C. 154(b) by 145 days.

(21) Appl. No.: 13/216,766

(22) Filed: Aug. 24, 2011

(65) Prior Publication Data
US 2012/0187514 A1 Jul. 26, 2012

Related U.S. Application Data

(60) Provisional application No. 61/435,112, filed on Jan. 21, 2011.

(51) Int. Cl.
*H01L 31/0232* (2006.01)
*H01L 21/00* (2006.01)

(52) U.S. Cl.
USPC ............... 257/432; 257/E31.127; 438/73

(58) Field of Classification Search
USPC ................. 438/73; 257/432, E31.127
See application file for complete search history.

(56) References Cited

U.S. PATENT DOCUMENTS

| 6,429,036 | B1 | 8/2002 | Nixon |
| 7,525,587 | B2 | 4/2009 | Bock |
| 2011/0136288 | A1* | 6/2011 | Duane et al. ............ 438/59 |

* cited by examiner

*Primary Examiner* — David S Blum (57) ABSTRACT

The present invention relates to a backside illuminated (BSI) imager having a plurality of layers. A plurality of pixel sensors are positioned on a first layer of a substrate. Pixel select conductors are positioned on the substrate in front of the first layer. Pixel readout conductors including a plurality of output lines, pixel power conductors, and a ground conductor are positioned on the substrate in front of the pixel select conductors. A plurality of sample and hold capacitors coupled to the pixel output lines are positioned vertically and/or horizontally on the substrate in front of the ground conductor.

20 Claims, 7 Drawing Sheets

SYSTEM FOR REDUCING SENSOR AREA IN A BACK SIDE ILLUMINATED CMOS ACTIVE PIXEL SENSOR

CROSS REFERENCE TO RELATED APPLICATIONS

This application claims priority of U.S. Provisional Patent Application Ser. No. 61/435,112, filed Jan. 21, 2011, which is incorporated herein by reference.

FIELD OF THE INVENTION

The present invention relates, in general, to a back-side illuminated (BSI) imager. Specifically, the BSI imager implements all, or a portion, of the sample and hold (S/H) column capacitors overlapping the pixels in the imager. More specifically, the capacitors are implemented as metal to metal plates that are positioned horizontally, vertically or in a combination on the front side of the BSI imager.

BACKGROUND OF THE INVENTION

In conventional BSI imagers, various metal wires that connect to pixels in the pixel array are positioned on the front side of the imager so that photons are unimpeded to the photodiodes which receive light through the back side of the imager. These conventional BSI imagers, however, position the column S/H capacitors (e.g. poly-silicon capacitors) above and/or below the pixel array which results in an increased column height (i.e. increased pixel array size).

DETAILED DESCRIPTION

As will be described, the present invention provides a BSI imager implementing metal S/H parasitic capacitors on the front side (i.e. overlapping the pixels) of the BSI the pixel array. The present invention also provides a method of making the BSI imager. In general, the metal plate capacitors are positioned in a layer on the front side of the BSI imager along with the other wiring/conductors (i.e. pixel selection wires, pixel output wires, pixel power wires, etc.). The capacitors are positioned vertically, horizontally, or a combination of horizontally and vertically with respect to the pixel array. One benefit from this configuration is that a smaller imager (i.e. shorter column height) may be formed.

Figure 1A:
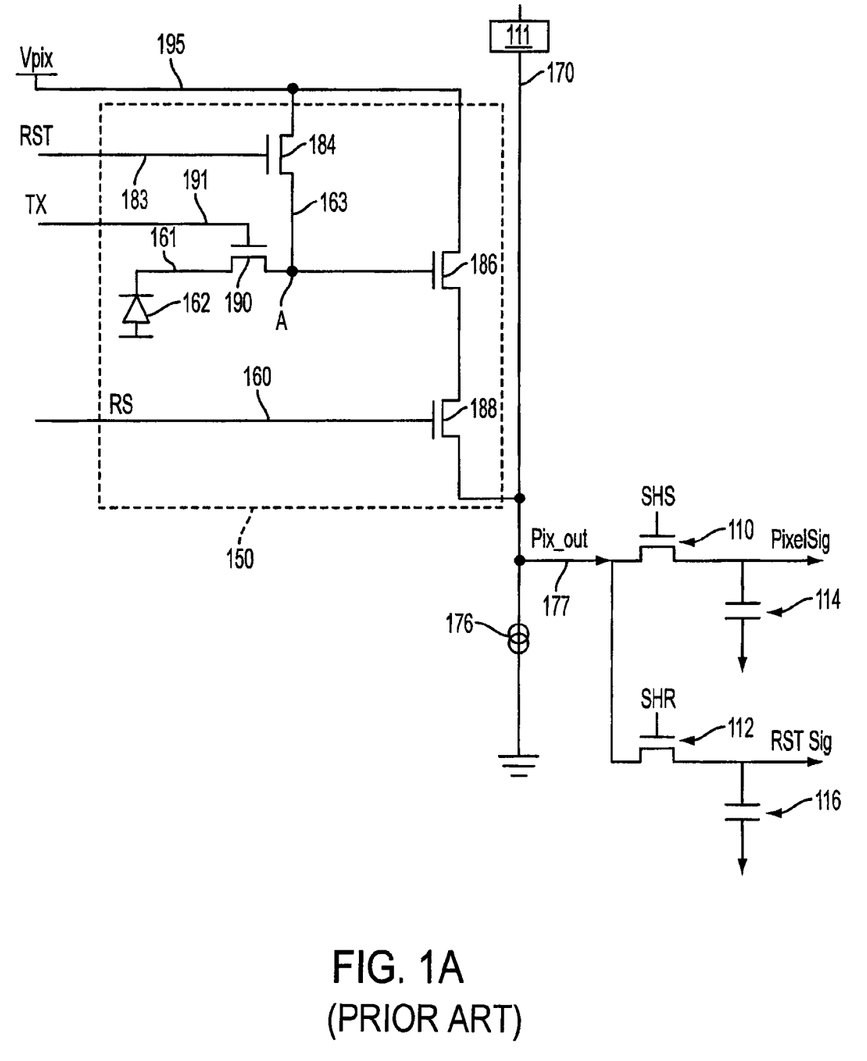
FIG. 1A is a view of a conventional 4 transistor (4T) pixel architecture.

A conventional four transistor (4T) circuit for a pixel 150 of a CMOS imager is illustrated in FIG. 1A. Pixel 150 is a 4T pixel, where 4T is commonly used in the art to designate use of four transistors to operate the pixel. The 4T pixel 150 has a photo-sensor such as a photodiode 162, a reset transistor 184, a transfer transistor 190, a source follower transistor 186, and a row select transistor 188. It should be understood that FIG. 1A shows the circuitry for operation of a single pixel 150, and that in practical use, there may be an M×N array of pixels arranged in rows and columns with the pixels of the array accessed using row and column select circuitry, as described in more detail below.

Photodiode 162 converts incident photons to electrons which are selectively passed to a floating diffusion stage node A through transfer transistor 190 when activated by the TX control signal. The source follower transistor 186 has its gate terminal connected to node A and thus amplifies the signal appearing at floating diffusion node A. When a particular row containing pixel 150 is selected by an activated row select transistor 188, the signal amplified by the source follower transistor 186 is passed on a column line 170 to a column readout circuitry 242. The photodiode 162 accumulates a photo-generated charge in a doped region of the substrate. It should be understood that the pixel 150 may include a photogate or other photon to charge converting device, in lieu of a photodiode, as the initial accumulator for photo-generated charge.

The gate terminal of transfer transistor 190 is coupled to a transfer control signal line 191 for receiving the TX control signal, thereby serving to control the coupling of the photodiode 162 to node A. A voltage source Vpix is coupled through reset transistor 184 and conductive line 163 to node A. The gate terminal of reset transistor 184 is coupled to a reset control line 183 for receiving the RST control signal to control the reset operation in which the voltage source Vpix is connected to node A.

A row select signal (RS) on a row select control line 160 is used to activate the row select transistor 188. Although not shown, the row select control line 160 used to provide a row select signal (RS) to all of the pixels of the same row of the array, as are the RST and TX lines. Voltage source Vpix is coupled to transistors 184 and 186 by conductive line 195. A column line 170 is coupled to all of the pixels of the same column of the array and typically has a current sink 176 at its lower end. The upper part of column line 170, outside of the pixel array, includes a pull-up circuit 111 which is used to selectively keep the voltage on column line 170 high. Maintaining a positive voltage on the column line 170 during an image acquisition phase of a pixel 150 keeps the potential in a known state on the column line 170. Signals from the pixel 150 are therefore selectively coupled to a column readout circuit through the column line 170 and through a pixel output ("Pix_out") line 177 coupled between the column line 170 and the column readout circuit.

In general, Pix_out line 177 is coupled to the sample and hold (S/H) column capacitors 114 and 116 (i.e. two capacitors per column line to perform correlated double sampling). Transistors 110 and 112 are also included to ensure that the pixel output signals (i.e. the potentials after reset and integration) are each stored on the appropriate capacitor. These two potentials are compared (i.e. subtracted from each other) to perform correlated double sampling (see description below).

Figure 1B:
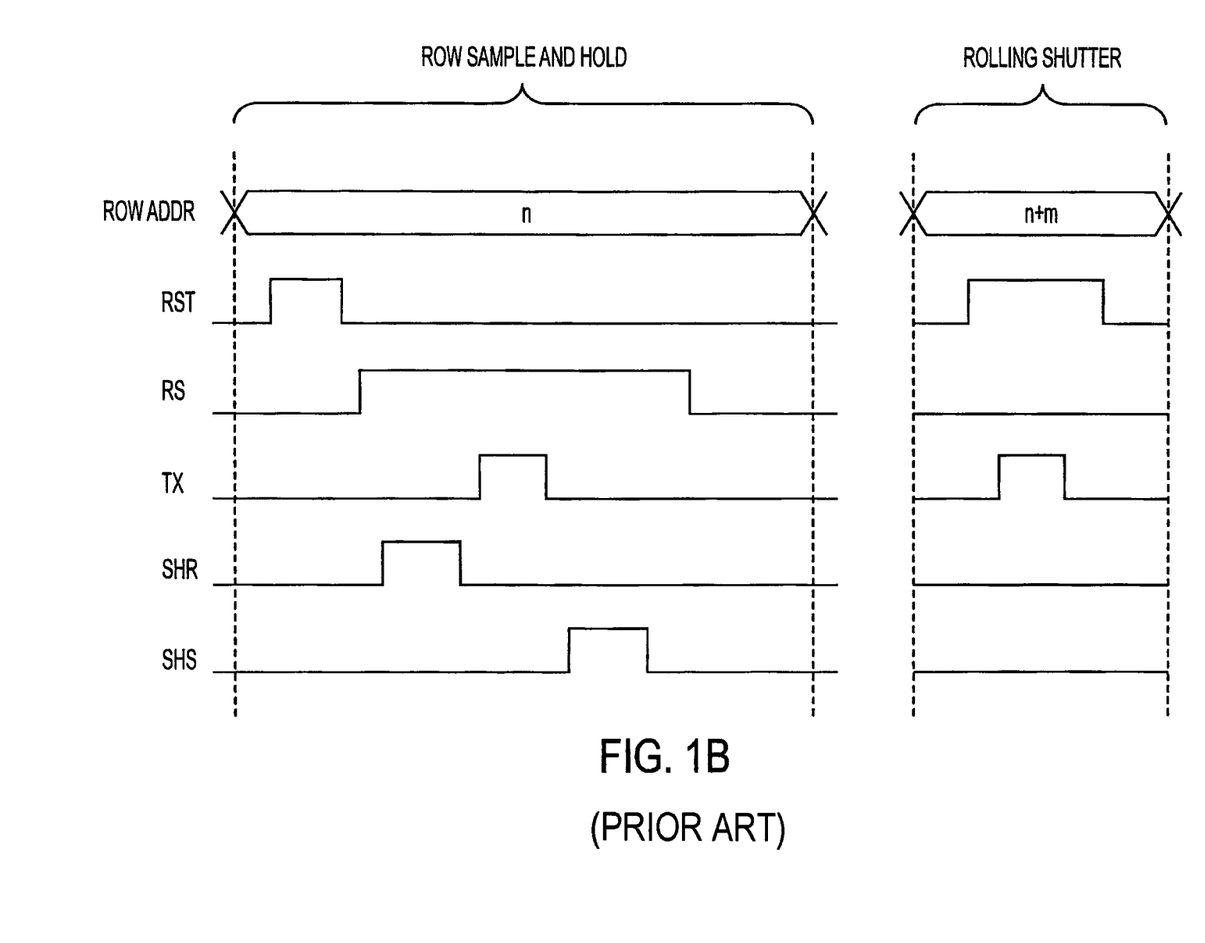
FIG. 1B is a timing diagram for the conventional readout sequence of the 4T pixel architecture.

As shown in FIG. 1B, a value can be read from pixel 150 in a two step correlated double sampling process. Prior to a charge integration period, node A and node 161 are reset to a high potential by activating reset transistor 184 and transfer transistor 190. During the charge integration period, photodiode 162 produces a charge from incident light. This is also known as the image acquisition period. During the pixel sample and hold period (as shown in FIG. 1B), node A is again reset to a high potential by activating reset transistor 184. The charge (i.e. reset signal) at node A after reset is readout to column line 170 via the source follower transistor 186 and row select transistor 188. Readout circuitry 242 in FIG. 2A then samples and holds the reset signal on capacitor 116. Transfer transistor 190 is then activated, and the charge from photodiode 162 is passed to node A, where the charge is amplified by source follower transistor 186 and passed to column line 170 through row select transistor 188. Readout circuitry 242 then samples and holds the integrated charge signal on capacitor 114. As a result, two different voltage signals are readout, sampled and held on capacitors 114 and 116 for further processing. Typically, all pixels in a row are readout simultaneously onto respective column lines 170.

Figure 2A:
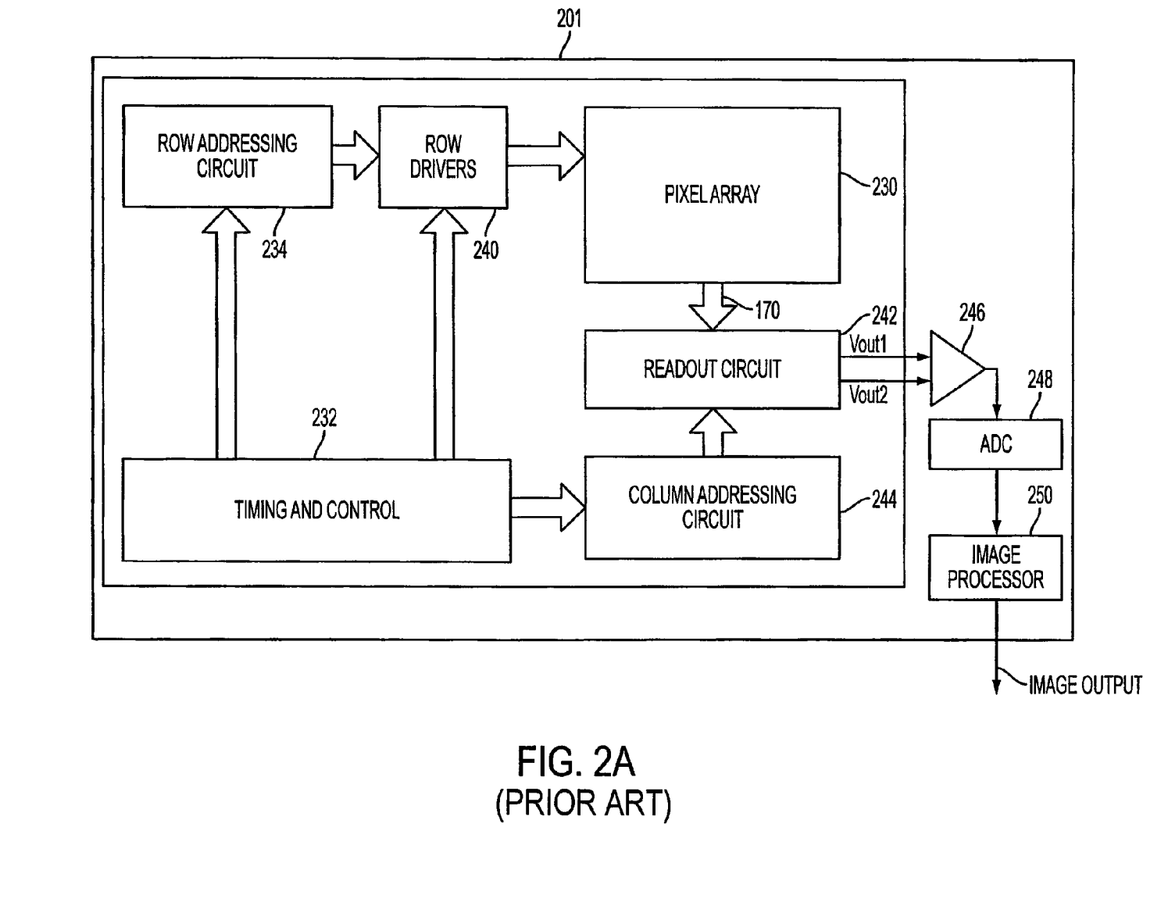
FIG. 2A is a view of a conventional complimentary metal oxide semiconductor (CMOS) imager architecture.

FIG. 2A shows an example CMOS imager integrated circuit chip 201 that includes an array 230 of pixels and a controller 232, which provides timing and control signals to enable reading out of signals stored in the pixels in a manner commonly known to those skilled in the art. Exemplary arrays have dimensions of M×N pixels, with the size of the array 230 depending on a particular application. The pixel signals from the array 230 are read out a row at a time using a column parallel readout architecture. The controller 232 selects a particular row of pixels in the array 230 by controlling the operation of row addressing circuit 234, row drivers 240 and column addressing circuit 244. Signals corresponding to charges stored in the selected row of pixels and reset signals are provided on the column lines 170 to a column readout circuit 242 in the manner described above. The pixel signal read from each of the columns can be readout sequentially using a column addressing circuit 244. Pixel signals (Vrst, Vsig) corresponding to the readout reset signal and integrated charge signal are provided as respective outputs Vout1, Vout2 of the column readout circuit 242 where they are subtracted in differential amplifier 246, digitized by analog to digital converter 248, and sent to an image processor circuit 250 for image processing.

Figure 2B:
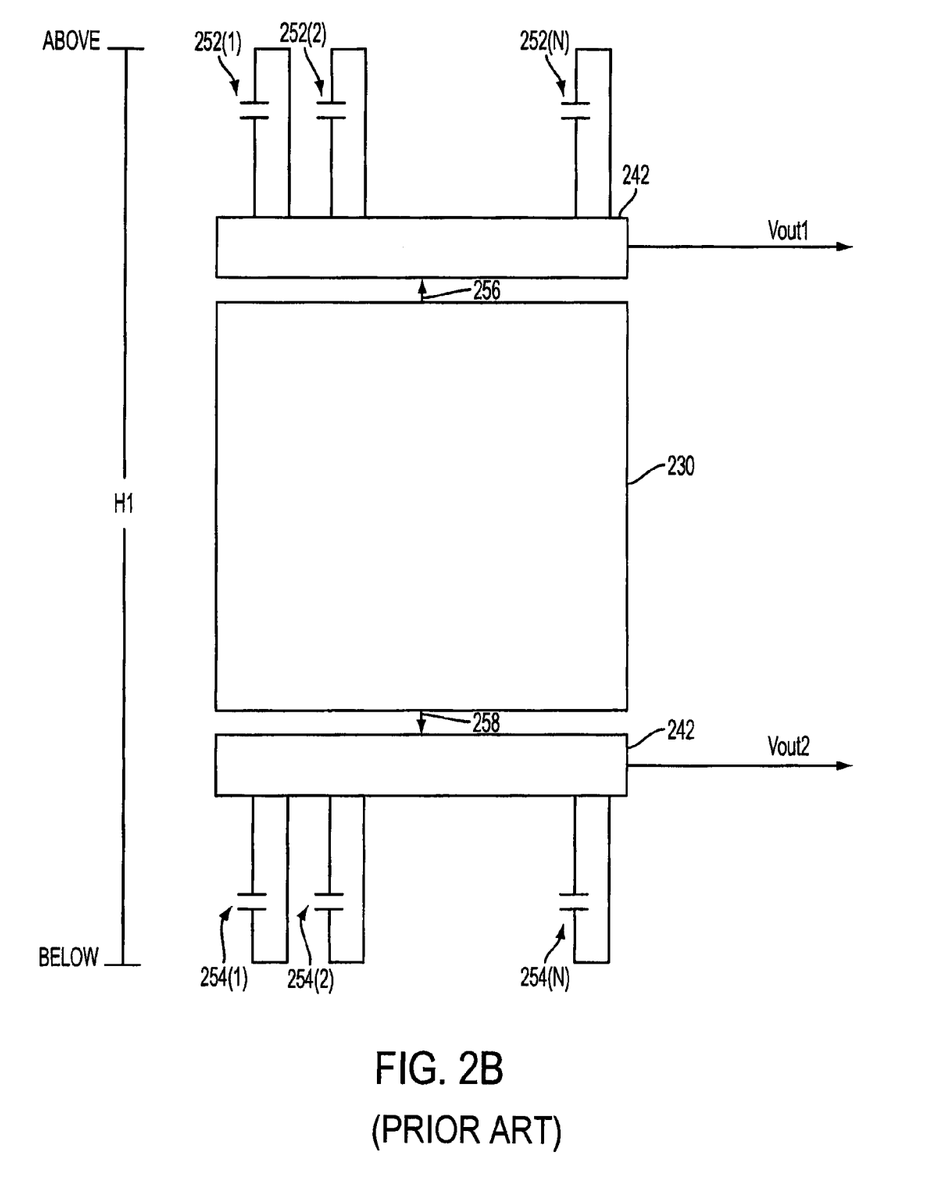
FIG. 2B is a detailed view of a conventional imager with the column S/H capacitors positioned above and below the pixel array.

As shown in FIG. 2B, the CMOS imager may be configured such that readout circuitry 242 is positioned above and/or below pixel array 230. In general, readout circuitry 242 may include the column S/H capacitors for sampling and outputting analog pixel values Vout1 and Vout2.

In one example, column S/H capacitor 252(1)-252(N) may be positioned above (i.e. top of FIG. 2B) pixel array 230 for sampling the pixel signal, whereas S/H capacitors 254(1)-254(N) may be positioned below (i.e. bottom of FIG. 2B) pixel array 230 for sampling the reset signal during the correlated double sampling process. It is noted that in one example, all (or a portion) of the S/H capacitors 252(1)-252(N), and 254(1)-254(N) may be positioned above, below, or to the side of pixel array 230.

During operation, the pixel array operates similarly as described above. For example, the reset values on pixels in array 230 may be sampled by capacitors 254(1)-254(N) via the plurality of column lines 258 thereby producing signals Vout2. Then, after transfer, the pixel values from the pixels in array 230 may then be sampled by capacitors 252(1)-252(N) via column lines 256 thereby producing signals Vout1. In general, the Vout1 signals, Vout2 signals may be subtracted from each other during the correlated double sampling procedure before the resulting output signal is digitized (as described above).

By positioning S/H capacitors 252(1)-252(N) and 254(1)-254(N) above and/or below pixel array 230, the overall column height H1 is increased. In general, this leads to an increase size of the CMOS imager.

In order to reduce the overall column height of the imager, the S/H capacitors may be implemented on the front side (i.e. overlapping pixel array 230) of the BSI imager. This implementation is at least shown in FIG. 3 where S/H capacitors 316(1)-316(N) and 318(1)-318(N) are positioned on the front side of the imager overlapping pixel array 230. In general, positioning the S/H capacitors on the front side of the BSI imager results in a reduction in the overall column height H2.

Figure 3:
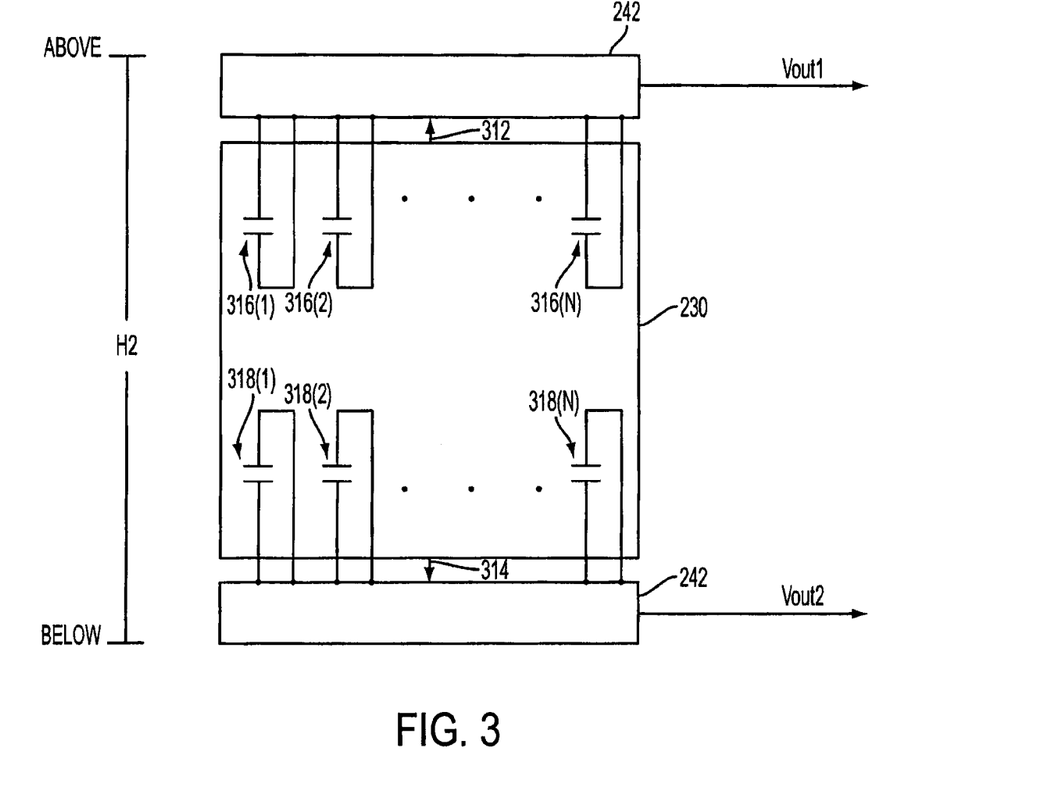
FIG. 3 is a detailed view of a pixel array with the column S/H capacitors positioned on the front side of the imager overlapping the pixels, according to an embodiment of the present invention.

Although FIG. 3 shows that all of the S/H column capacitors are overlapping pixel array 230, it is noted that some of the capacitors may be positioned above and/or below pixel array 230 (i.e. BSI imager may include S/H column capacitors on the front side of the imager that overlap the pixel array and/or do not overlap the pixel array.

In general, the column S/H capacitors in conventional imagers are poly-silicon capacitors. Poly-silicon capacitors are implemented in conventional imagers because they are small (i.e. have a relatively high density). This is desirable in most conventional imagers due to restrictions in the column height (i.e. smaller capacitors equal smaller column height which is beneficial). However, there is a kt/c sampling noise tradeoff (i.e. the smaller the capacitor, the larger the noise).

In the present invention, since the capacitors are implemented on the front side of the imager overlapping pixel array 230, larger (less dense and less complex) capacitors may be utilized. For example, the capacitors may be designed as metal-to-metal parallel plates (i.e. metal parasitic capacitance). In general, metal-to-metal parallel plate capacitors generally have a lower density than the poly-silicon capacitors. However, these larger capacitors are not detrimental to the column height because they are implemented to overlap pixel array 230 (i.e. the area behind pixel array 230 is large and can accommodate the larger capacitors). Thus, simpler to manufacture metal-to-metal parallel plates may be used in place of poly-silicon capacitors which will reduce the complexity of the overall imager design.

Figure 4:
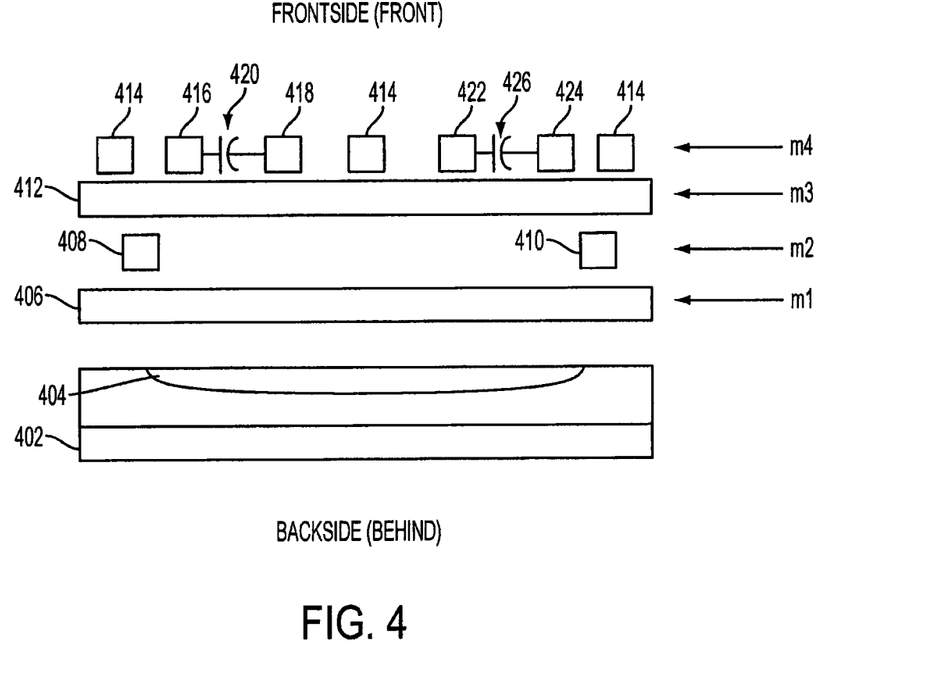
FIG. 4 is a cross sectional view of a pixel array with horizontally positioned capacitors on the front side of the imager, according to an embodiment of the present invention.
Figure 5:
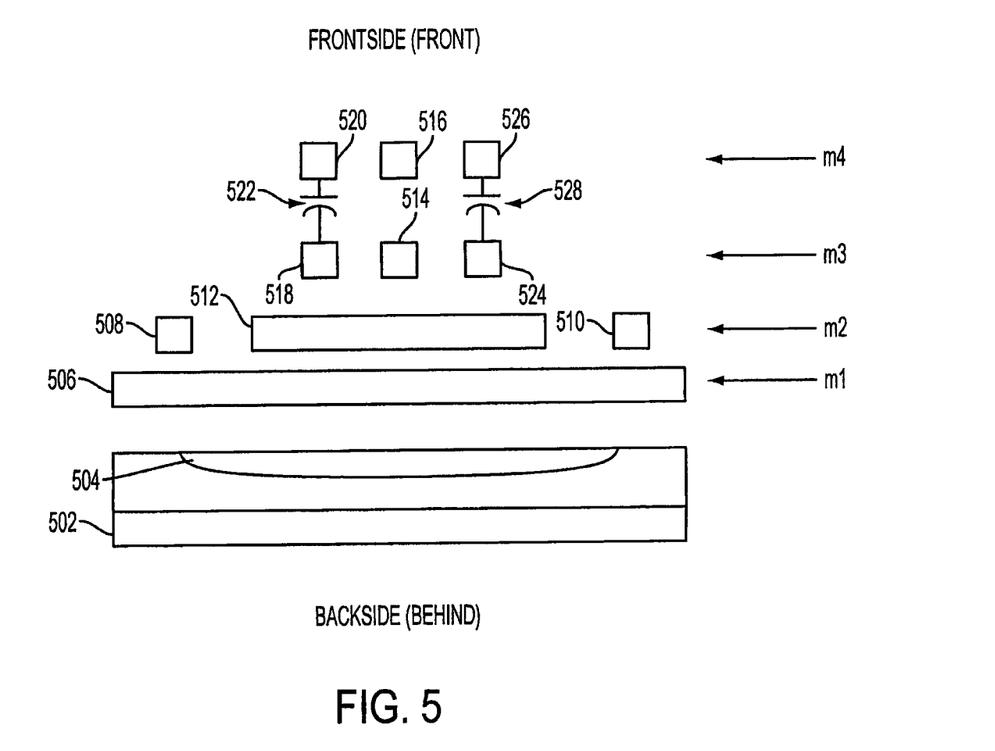
FIG. 5 is a view of a pixel array with vertically positioned capacitors on the front side of the imager, according to an embodiment of the present invention.

Shown in FIGS. 4 and 5, are two cross-sectional views showing the various layers of the BSI imager for an embodiment implementing horizontally positioned capacitors and vertically positioned capacitors.

A horizontal configuration of the sample and hold capacitors is shown as BSI imager in FIG. 4. Specifically, the backside of the imager may include a color filter layer 402 which may include a color filter array (CFA) such as a Bayer pattern that filters the incoming photons that are impinging on the pixel sensors. Positioned above layer 402 is a layer of pixel sensors 404 that may be implemented as photodiodes. The pixel select circuitry is also implemented in layer 404. The pixel select circuitry may include various transistors (i.e. transfer transistors, reset transistors, row select transistors, source follower transistors and a floating diffusion as shown in FIG. 1A) interconnected by conductive traces and pixel select lines in layer 406. These transistors may be powered by another layer which includes pixel readout conductors and power conductors (i.e. output line 408 and Vpix power line 410). Above pixel output line 408 and Vpix line 410, is a ground plane 412 (i.e. a grounded conductor) that blocks (i.e. shields) charge from leaking between the S/H capacitors and the rest of the pixel circuitry.

Thus, on the front side of the imager (i.e. top layer), the S/H capacitors may be implemented in a horizontal arrangement. For example, a first capacitor which includes metal plates 416 and 418 may generate a parasitic capacitance 420 (i.e. capacitor 420 is not an actual capacitor but the parasitic capacitance between the metal plates). Another capacitor may include metal plates 422 and 424 which has parasitic capacitance 426. Each capacitor may then be isolated from the other capacitors by including ground lines 414 (i.e. other grounded conductors) in the top layer. Thus, the capacitors are isolated from the rest of pixel circuitry via ground plane 412, and are also isolated from each other via a ground lines 414.

In general, the top four layers of the BSI imager are referred to as metal layers M1, M2, M3 and M4. It is also noted that these layers may be separated from each other by a dielectric (e.g. silicon-dioxide) and connected to each other utilizing metal vias (i.e. pixel output lines 408 may be coupled to the column S/H capacitors utilizing metal vias). It is also noted that the pixel wiring may be distributed over more than 4 metal layers.

In one example, the column lines may be extended below and above the ground plane conductor. Metal vias (spanning metal layers above and below the ground plane conductor) may then couple the extended column lines to the S/H capacitors on the opposite side of the ground plane conductor (i.e. the column lines on the back side of the ground plane are extended and wrapped around to the front side of the ground plane where they are coupled to the capacitors). Implementing the metal vias below and above the ground plane (rather than through the ground plane) may be beneficial to avoid electrical interference between the S/H capacitors and the pixel array. It is noted that although FIG. 4 shows only two S/H capacitors, multiple S/H capacitors may be implemented (e.g. in general, two capacitors per column may be implemented).

In another embodiment, as shown in FIG. 5, a BSI imager including vertically positioned S/H capacitors may be implemented. In general, the first three layers (502, 504, and 506) are the CFA, photodiodes and pixel select conductors similar to those shown in FIG. 4. One difference between FIG. 4 and FIG. 5, is that FIG. 5 implements vertical capacitors rather than horizontal capacitors. For example, a first capacitor may be implemented by metal plates 518 and 520 producing parasitic capacitance 522, whereas another capacitor may be implemented by metal plates 524 and 526 producing parasitic capacitance 528. Similar to FIG. 4, the capacitors in FIG. 5 may be isolated from each other as well as from the rest of the pixel circuitry by ground plane conductors 512, 514 and 516 respectively.

Another difference between FIG. 4 and FIG. 5 is that the capacitors in FIG. 5 are positioned vertically. Vertical capacitors result in a configuration where the capacitors overlap a smaller portion of the pixel array, and therefore pixel output lines 508 and pixel power lines Vpix 510 may be implemented in the same layer as ground plane 512 (i.e. the column S/H capacitors do not overlap lines 508 and 510). Thus, pixel output/power lines 508 and 510 may not need to be shielded from the S/H capacitors by the ground plane.

Although not shown, another embodiment may include a combination of vertically positioned and horizontally positioned column S/H capacitors. For example, some of the S/H column capacitors may be positioned vertically similar to FIG. 5, and some of the S/H column capacitors may be positioned horizontally as shown in FIG. 4. In this combination embodiment, multiple ground plane conductors may be used to isolate the capacitors from each other as well as isolate the capacitors from the other lines/circuitry within the pixel array.

In general, smaller capacitors result in higher column noise than larger capacitors. Thus, the BSI imager may be implemented with a lower column noise since the capacitor sizes may be increased while not/minimally increasing the column height. For example, the larger metal to metal parasitic capacitors reduce the column noise while minimally affecting the column height by efficiently utilizing the area overlapping the pixel array (i.e. all of or most of the capacitors may be implemented to overlap the pixels depending on their respective sizes). In general, the imager may be designed as a tradeoff between increased capacitor size which results in lower column noise and larger column height, or decreased capacitor size which results in higher column noise and smaller column height.

In one example, the size of the capacitors may be designed such that all of the columns S/H capacitors are positioned to overlap the pixel array and therefore reduce column height. In another example, the size of the capacitors may be designed such that some of the column S/H capacitors are positioned to overlap the pixel array, while others are positioned above and/or below the pixel array to reduce column noise.

As described above, the present invention provides a BSI imager implementing metal S/H parasitic capacitors on the front side (i.e. overlapping the pixels) of the BSI the pixel array. The present invention also provides a method of making the BSI imager. The capacitors are positioned in a layer on the front side of the BSI imager along with the other wiring (i.e. pixel selection conductors, pixel output conductors, pixel power conductors, etc.). The capacitors are positioned vertically, horizontally, or a combination with respect to the pixel array.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A backside illuminated (BSI) imager having a plurality of layers, including:
   a plurality of pixel sensors positioned on a first layer of a substrate;
   pixel select conductors positioned on the substrate in front of the first layer;
   pixel readout conductors, pixel power conductors, and a ground conductor positioned on the substrate in front of the pixel select conductors, the pixel readout conductors including a plurality of pixel output lines; and
   a plurality of sample and hold capacitors positioned vertically on the substrate in front of the ground conductor, the plurality of sample and hold capacitors coupled to the pixel output lines.

2. The BSI imager of claim 1, including
   a color filter array (CFA) positioned in the substrate behind the first layer; and
   an optical lens positioned in the substrate behind the CFA.

3. The BSI imager of claim 1,
   wherein the readout conductors, power conductors and the ground conductor are positioned on a common layer in the substrate.

4. The BSI imager of claim 1,
   wherein the ground conductor is positioned between each of the plurality of sample and hold capacitors.

5. The BSI imager of claim 1,
   wherein each of the plurality of sample and hold capacitors include two metal plates positioned on two different layers in the substrate and separated by a dielectric.

6. The BSI imager of claim 1, wherein some of the plurality of sample and hold capacitors are positioned above or below the plurality of pixel sensors.

7. The BSI imager of claim 1, wherein all of the plurality of sample and hold capacitors are positioned to overlap the plurality of pixel sensors.

8. The BSI imager of claim 1, wherein some of the plurality of sample and hold capacitors are positioned horizontally in the substrate in front of the ground conductor.

9. A backside illuminated (BSI) imager having a plurality of layers, including:
   a plurality of pixel sensors positioned in a first layer of a substrate;
   pixel select conductors positioned in the substrate in front of the first layer;
   pixel readout conductors and pixel power conductors positioned in the substrate in front of the pixel select conductors, the pixel readout conductors including a plurality of pixel output lines;
   a ground conductor positioned in the substrate in front of the pixel readout conductors and pixel power conductors; and
   a plurality of sample and hold capacitors positioned horizontally in the substrate in front of the ground conductor, the plurality of sample and hold capacitors coupled to the pixel output lines.

10. The BSI imager of claim 9, including
    a color filter array (CFA) positioned in the substrate behind the first layer; and
    an optical lens positioned in the substrate behind the CFA.

11. The BSI imager of claim 9, wherein the readout conductors and power conductors are positioned on layer of the substrate that is different from the ground conductor.

12. The BSI imager of claim 9, wherein the ground conductor is positioned between each of the plurality of sample and hold capacitors.

13. The BSI imager of claim 9, wherein each of the plurality of sample and hold capacitors include two metal plates positioned on a common layer in the substrate and separated by a dielectric.

14. The BSI imager of claim 9, wherein some of the plurality of sample and hold capacitors are positioned above or below the plurality of pixel sensors.

15. The BSI imager of claim 9, wherein all of the plurality of sample and hold capacitors are positioned to overlap the plurality of pixel sensors.

16. The BSI imager of claim 9, wherein some of the plurality of sample and hold capacitors are positioned vertically in the substrate in front of the ground conductor.

17. A method for making a backside illuminated (BSI) imager, the method including the steps of:
    forming a plurality of pixel sensors and pixel select circuits in a first layer of a substrate;
    forming pixel select conductors, pixel readout conductors and pixel power conductors on the substrate in front of the first layer, the pixel readout conductors including a plurality of pixel output lines;
    forming a ground conductor on the substrate in front of the pixel select conductors; and
    forming a plurality of sample and hold capacitors on the substrate in front of the ground conductor, the plurality of sample and hold capacitors coupled to the pixel output lines.

18. The method of claim 17, wherein forming the plurality of sample and hold capacitors includes forming two metal plates on different layers in the substrate and separated by a dielectric.

19. The method of claim 17, wherein forming the plurality of sample and hold capacitors includes forming two metal plates on a common layer in the substrate and separated by a dielectric.

20. The method of claim 17, including
    forming metal vias through the ground conductor to couple the sample and hold capacitors to the pixel output lines.

* * * * *